United States Patent
Cui et al.

(10) Patent No.: US 11,718,812 B2
(45) Date of Patent: Aug. 8, 2023

(54) POST-CMP CLEANING COMPOSITION FOR GERMANIUM-CONTAINING SUBSTRATE

(71) Applicant: Taiwan Semiconductor Manufacturing Co., Ltd., Hsinchu (TW)

(72) Inventors: Ji Cui, Bolingbrook, IL (US); William Weilun Hong, Hsinchu (TW); Gin-Chen Huang, Hsinchu (TW); Shich-Chang Suen, Hsinchu (TW); Kei-Wei Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 227 days.

(21) Appl. No.: 17/191,534

(22) Filed: Mar. 3, 2021

(65) Prior Publication Data
US 2021/0371774 A1    Dec. 2, 2021

Related U.S. Application Data

(60) Provisional application No. 63/031,292, filed on May 28, 2020.

(51) Int. Cl.
| | | |
|---|---|---|
| *C11D 3/43* | (2006.01) | |
| *C11D 1/40* | (2006.01) | |
| *H01L 29/66* | (2006.01) | |
| *H01L 29/78* | (2006.01) | |
| *H01L 21/304* | (2006.01) | |
| *H01L 21/306* | (2006.01) | |
| *H01L 21/321* | (2006.01) | |
| *C11D 11/00* | (2006.01) | |
| *C11D 3/37* | (2006.01) | |
| *C11D 3/30* | (2006.01) | |
| *C11D 3/00* | (2006.01) | |
| *H01L 21/02* | (2006.01) | |

(52) U.S. Cl.
CPC ............. *C11D 1/40* (2013.01); *C11D 3/0047* (2013.01); *C11D 3/30* (2013.01); *C11D 3/3723* (2013.01); *C11D 3/3773* (2013.01); *C11D 3/43* (2013.01); *C11D 11/0047* (2013.01); *H01L 21/02041* (2013.01); *H01L 21/304* (2013.01); *H01L 21/306* (2013.01); *H01L 21/3212* (2013.01); *H01L 29/66795* (2013.01); *H01L 29/785* (2013.01)

(58) Field of Classification Search
CPC .................................................. C11D 11/0047
USPC .......................................................... 510/175
See application file for complete search history.

(56) References Cited

U.S. PATENT DOCUMENTS

| | | | | |
|---|---|---|---|---|
| 2003/0119692 | A1* | 6/2003 | So ............................ | C11D 3/30 510/499 |
| 2004/0048761 | A1* | 3/2004 | Ikemoto ............... | C11D 3/3723 510/176 |
| 2016/0300730 | A1* | 10/2016 | Wu .......................... | C09G 1/04 |

* cited by examiner

*Primary Examiner* — Gregory E Webb
(74) *Attorney, Agent, or Firm* — Seed IP Law Group LLP

(57) ABSTRACT

A cleaning composition for cleaning a surface of a substrate comprising silicon germanium after a chemical mechanical polishing process is provided. The cleaning composition includes an oligomeric or polymeric polyamine, at least one wetting agent, a pH adjusting agent, and a solvent.

20 Claims, 8 Drawing Sheets

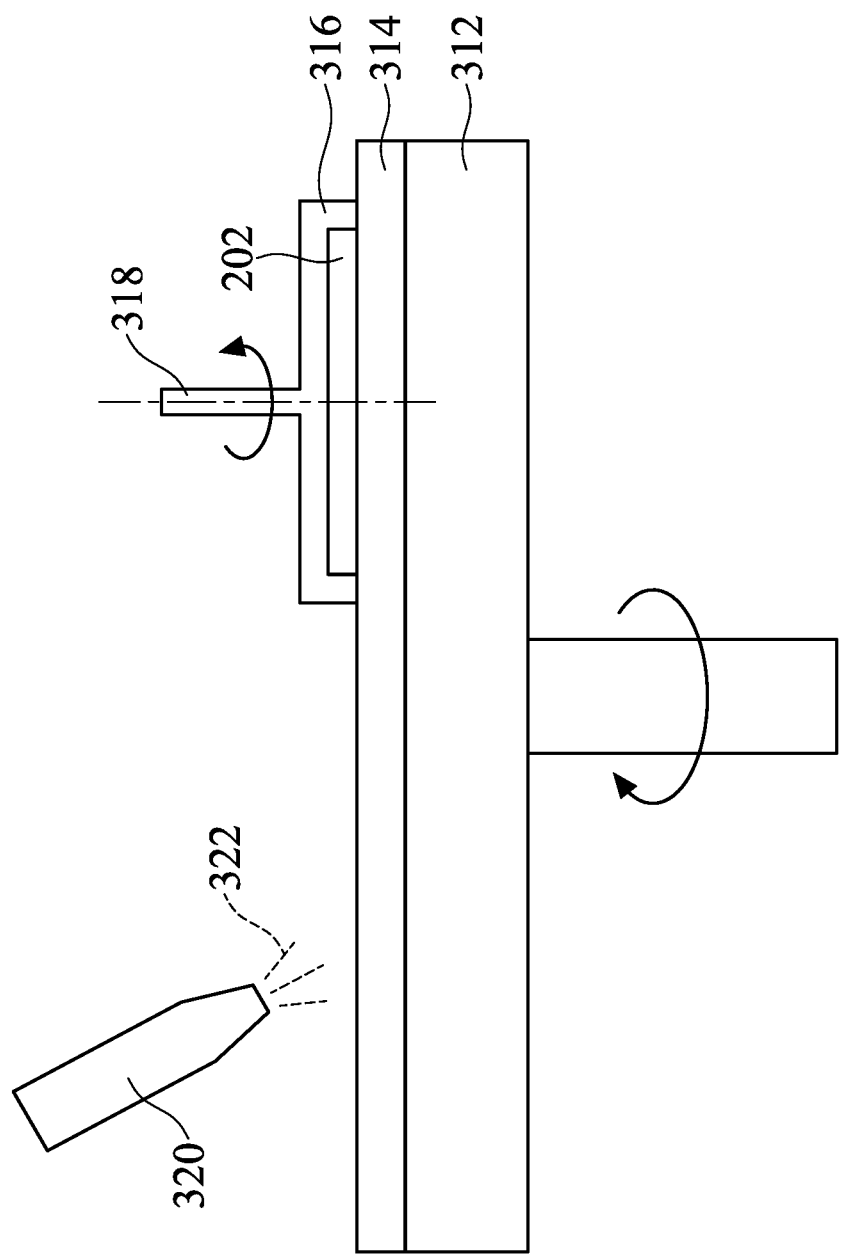

POST-CMP CLEANING COMPOSITION FOR GERMANIUM-CONTAINING SUBSTRATE

PRIORITY CLAIM AND CROSS-REFERENCE

This application claims the benefit of priority to U.S. Provisional Application Ser. No. 63/031,292 filed on May 28, 2020, which application is incorporated by reference herein in its entirety.

BACKGROUND

With the increasing miniaturization of integrated circuits (IC) and increasing higher requirements for ICs, transistors need to have higher driving current with increasing smaller dimensions. As the continuous scale down of complementary metal-oxide-semiconductor (CMOS) field effect transistors (FETs) for high-speed and high-integration, methods of improving transistor performance become increasingly important. For certain technology node device requirements, it is necessary to use different channel materials for p-type FETs and n-type FETs. For example, by taking advantage of high hole mobility of a germanium-containing semiconductor such as silicon germanium (SiGe) and high electron mobility of silicon (Si), performance of hybrid channel CMOS FETs with SiGe as the p-channel material and Si as the n-channel material can be greatly enhanced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a cross-sectional view of a chemical mechanical polishing system, in accordance with some embodiments.

DETAILED DESCRIPTION

Figure 1:
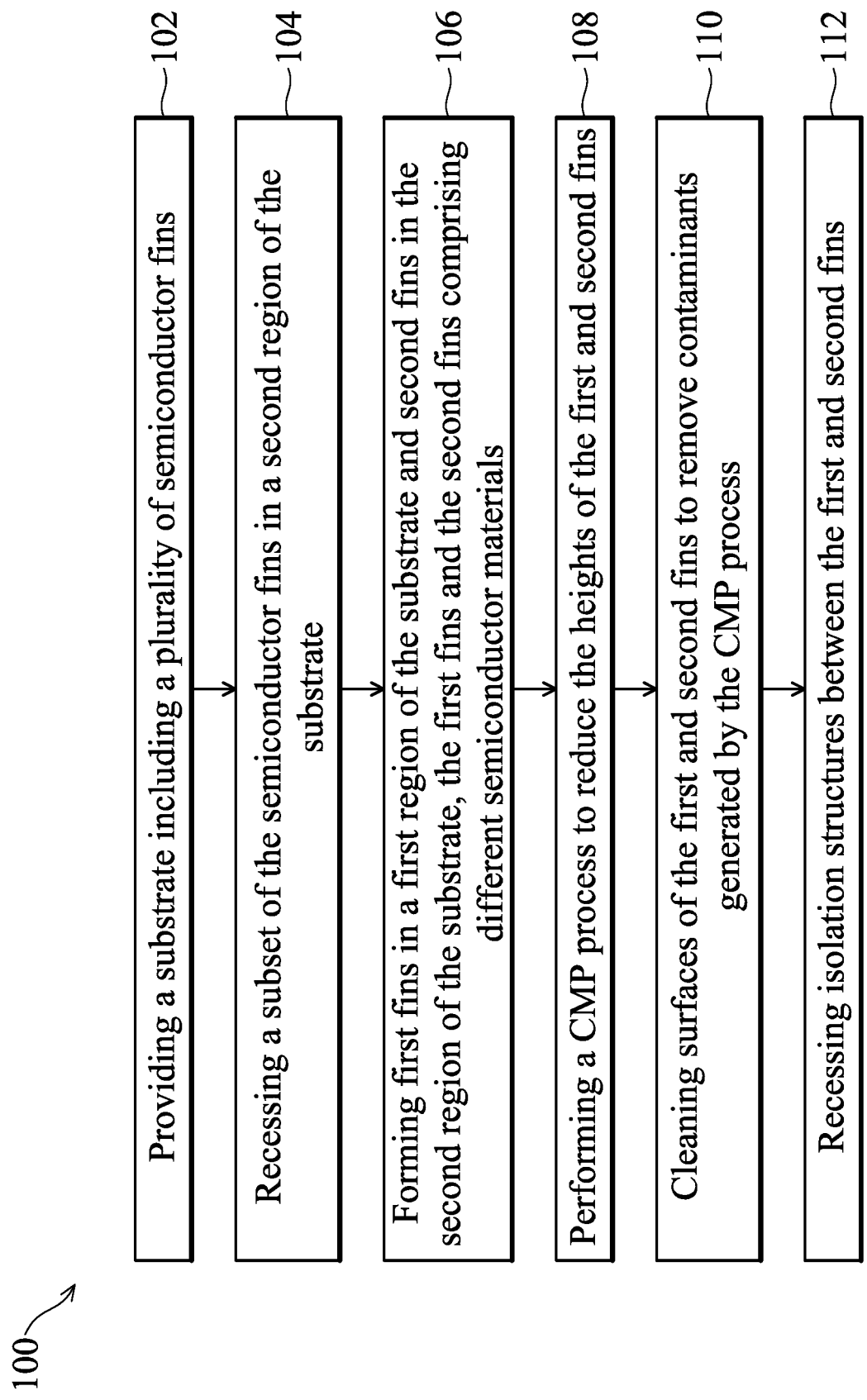
FIG. 1 is a flowchart of a method for fabrication of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Heterointegration of a germanium (Ge)-containing semiconductor material, for example, Ge or SiGe, with silicon is useful for achieving high performance CMOS FETs. One heterointegration method involves creation of confined regions of Ge or SiGe on a silicon substrate by epitaxial growth of Ge or SiGe from the silicon substrate. However, the Ge-containing regions have, after epitaxy, a high surface roughness. Chemical mechanical polishing (CMP) is thus necessary to reduce roughness of the Ge-containing regions and to remove the excess amount of Ge or SiGe, reaching final thickness.

CMP process is carried out by pressing a substrate surface against a polishing pad. In a typical CMP process, a polishing slurry containing both abrasive particles and reactive chemicals is applied to the polishing pad. The relative movement of the polishing pad and the substrate surface coupled with the reactive chemicals in the slurry allows the CMP process to planarize the wafer surface by means of both physical and chemical forces. A smooth and defect free surface improves the quality of devices subsequently formed thereon.

Although CMP processes are suitable for planarizing substrate surfaces, they tend to leave undesirable contaminants on the substrate surfaces. Such contaminants can have an adverse effect on device yield. To ensure high device yields, after a CMP process, the substrate surface is cleaned using an aqueous cleaning composition to remove residues. The residues may include polishing particles and organic additives such as corrosion inhibitors, passivator, and surfactants from the polishing slurry.

Substrates containing Ge suffer from corrosion issues during the post-CMP cleaning process because the redox potential of Si or Ge lies at or below the water hydrogen redox levels. The corrosion causes surface roughness and damage that deleteriously affect device performance. As semiconductor device sizes continue to shrink, the negative impact of corrosion of the Ge or SiGe containing regions to the device performance becomes more severe.

In embodiments of the present disclosure, a cleaning composition which helps to reduce corrosion of fins comprised of Ge or SiGe in the post-CMP cleaning process is provided. To achieve this goal, the cleaning composition includes an organic polyamine. The polyamine can be selectively absorbed onto the surfaces of Ge-containing fins such as Ge or SiGe fins to form a passivation layer over the fins. Such a passivation layer helps to block atmospheric oxygen from contacting Ge or SiGe directly during the post-CMP cleaning process so as to avoid the oxidation of Ge or SiGe. As a result, corrosion of Ge or SiGe fins is suppressed and the performance and stability of Ge or SiGe based FinFET devices are improved.

In some embodiments, the polyamine is an oligomeric or a polymeric polyamine. The term "polyamine", as used herein, refers to a compound with two or more amino groups. For example, the polyamine may be an n-amine with n equal to or greater than 2, such as diamine, a triamine, a tetramine, or a pentamine. The polyamines may be primary amines, secondary amines, tertiary amines, quaternary amines or combinations thereof.

Oligomeric polyamines, as used herein, refer to non-polymeric polyamine compounds have a molecular weight of less than about 400. The oligomeric polyamines can be aliphatic polyamines, alicyclic polyamines, or aromatic polyamines. Examples of suitable oligomeric polyamines that can be employed in the present disclosure include, but are not limited to, ethylenediamine, 1,4-butanediamine, diaminopentane, tris(2-aminoethyl)amine, diethylenetriamine, triethylenetetramine, tetraethylenepentamine, butane-1,1,4,4-tetraamine, benzenetetramine, tetraaminoethylene, isophorone diamine, methaxylene diamine, diaminodiphenyl methane, spermidine, spermine, thermospermine, any salt thereof, any derivative thereof, any combination thereof, and the like. In some embodiments, the oligomeric polyamine has at least three amino groups, wherein the three amino groups are primary, secondary, or a combination thereof. Examples include, but are not limited to, $H_2N(CH_2CH_2NH)_2H$, $H_2N(CH_2CH_2NH)_3H$, $H_2N(CH_2CH_2NH)_4H$, $H_2N(CH_2CH_2NH)_5H$, $H_2N(CH_2CH_2CH_2NH)_2H$, $H_2N(CH_2CH_2CH_2NH)_3H$, $H_2N(CH_2CH_2CH_2CH_2NH)_2H$, $H_2N(CH_2CH_2CH_2CH_2CH_2CH_2NH)_2H$, $H_2N(CH_2)_4NH(CH_2)_3NH_2$, $H_2N(CH_2)_3NH(CH_2)_4NH(CH_2)_3NH_2$, $H_2N(CH_2)_3NH(CH_2)_2NH(CH_2)_3NH_2$, $H_2N(CH_2)_2NH(CH_2)_3NH(CH_2)_2NH_2$, $H_2N(CH_2)_3NH(CH_2)_2NH_2$, $C_6H_5NH(CH_2)_2NH(CH_2)_2NH_2$, and $N(CH_2CH_2NH_2)_3$.

Polymeric polyamines, as used herein, refer to polyamine compound having a molecular weight no less than 400. Examples of suitable polymeric polyamines that can be employed in the present disclosure include, but are not limited to, linear or branched polyethyleneimine, polyvinyl amine, any salt thereof, any derivative thereof, any combination thereof, and the like. In some embodiments, the polymeric polyamine is polyethyleneimine having a molecular weight in the range of from 500 to 20,000,000.

In some embodiments, the oligomeric or polymeric polyamine may also contain one or more hydroxyl functional groups.

The cleaning composition may also contain other chemicals that perform different functions during the post-CMP cleaning process. In some embodiments, the cleaning composition includes at least one wetting agent. The wetting agent is used in cleaning chemistries to improve wetting of the hydrophobic surface being cleaned and help to remove contaminants from the surface, thereby preventing the re-deposition of these contaminants on the surface. The wetting agent may also help to reduce water-marks on the surface, which are the defects formed during the drying phase, which follows cleaning. Any type of surfactant such as anionic, cationic, non-ionic, or zwitterionic surfactant may be used as the wetting agent. The choice of this surfactant may depend upon various criteria, including wetting properties, foaming properties, detergency, rinsability, etc. Examples of anionic surfactants include, but are not limited to, linear alkylbenzene sulfonates (LAS), secondary alkylbenzene sulfonate, fatty alcohol sulfates (FAS), secondary alkanesulfonates (SAS), and fatty alcohol ether sulfates (FAES). Examples of cationic surfactants include, but are not limited to, quaternary ammonium salts such as trialkylbenzyl quaternary ammonium salt, tetraalkyl quaternary ammonium salt, and pyridinium quaternary ammonium salt. In some embodiments, the alkyl contains 1-6 carbons. Examples of suitable non-ionic surfactants include, but are not limited to, poly (alkylene oxide), alkynol type surfactants, siloxane type surfactants, and fluorinated surfactants such as fluorinated alkyl alkoxylates, and fluorinated poly oxyethylene alkanols. Still further exemplary surfactants include, but are not limited to, acetylenic diol type of surfactants, alcohol (primary and secondary) ethoxylates, amine ethoxylates, glucosides, glucamides, polyethylene glycols, and poly(ethylene glycol-co-propylene glycol). In some embodiments, at last one wetting agent includes a cellulose derivative. In some embodiments, the cellulose derivative is cellulose having alkyl, hydroxyalkyl and/or carboxyalkyl substituents, such as, for example, methylcelluloses, hydroxymethyl cellulose, hydorxyethyl cellulose, hydroxypropyl cellulose, hydroxybutyl cellulose, ethoxylated cellulose, propoxylated cellulose, and carboxymethyl cellulose.

The cleaning composition further includes a pH adjusting agent for adjusting the pH of the cleaning composition. The amount of the pH adjusting agent added to the cleaning composition should be sufficient to obtain a desired operating pH. In some embodiments, the pH adjusting agent is used to maintain a pH level of the cleaning composition in a range from about 2 to about 8. The pH adjuster may include an inorganic acid, an organic acid, or combinations thereof. Examples of inorganic acids include, but are not limited to, hydrochloric acid, nitric acid, sulfuric acid, phosphoric acid, perchloric acid and carbonic acid. Examples of organic acids include, but are not limited to oxalic acid, citric acid, maleic acid, malic acid, malonic acid, gluconic acid, glutaric acid, ascorbic acid, formic acid, acetic acid, ethylene diamine tetraacetic acid, diethylene triamine pentaacetic acid, C1-C6 alkyl carboxylic acid, and C1-C6 alkyl sulfonic acid. As used herein, the term "alkyl" refers to a straight-chain or branch-chain saturated aliphatic hydrocarbon radical containing a number of carbon atoms from 1 to 20, preferably from 1 to 10 and more preferably from 1 to 6 carbon atoms. Examples of alkyl radicals include, but are not limited to, methyl, ethyl, n-propyl, isopropyl, n-butyl, isobutyl, sec-butyl, tert-butyl, pentyl, isoamyl, n-hexyl and the like.

The cleaning composition may include from about 5 wt % to 50 wt % of oligomeric or polymeric polyamine, from about 0.01 wt % to 30 wt % of wetting agent, from about 5 wt % to 20 wt % of pH adjusting agent, and with the remaining balance of the composition being made of a polar solvent. Examples of polar solvents that can be employed in the present disclosure includes, but are not limited to, water, short-chain alcohols (e.g., butanol, isopropanol, propanol, ethanol, methanol), dioxane, tetrahydrofuran, dichloromethane, acetone, acetonitrile, dimethylformamide, dimethyl sulfoxide, acetic acid, formic acid, and combinations. In some embodiments, the solvent includes water, for example, deionized water. In some other embodiments, the solvent is a mixed solvent include water and an organic polar solvent described above.

FIG. 1 is a flowchart of a method 100 for fabrication of a semiconductor structure 200, in accordance with some embodiments of the present disclosure. FIGS. 2A-2E are cross-sectional views of the semiconductor structure 200 at various stages of the method 100, in accordance with some embodiments. The method 100 is discussed in detail below, with reference to the semiconductor structure 200, in FIGS. 2A-2E. Additional operations may be performed before, during, and/or after the method 100. In some embodiments, additional features are added to the semiconductor structure 200. In some embodiments, some of the features described below are replaced or eliminated. One of ordinary skill in the art would understand that although some embodiments are discussed with operations performed in a particular order, these operations may be performed in another logical order.

Figure 2A:
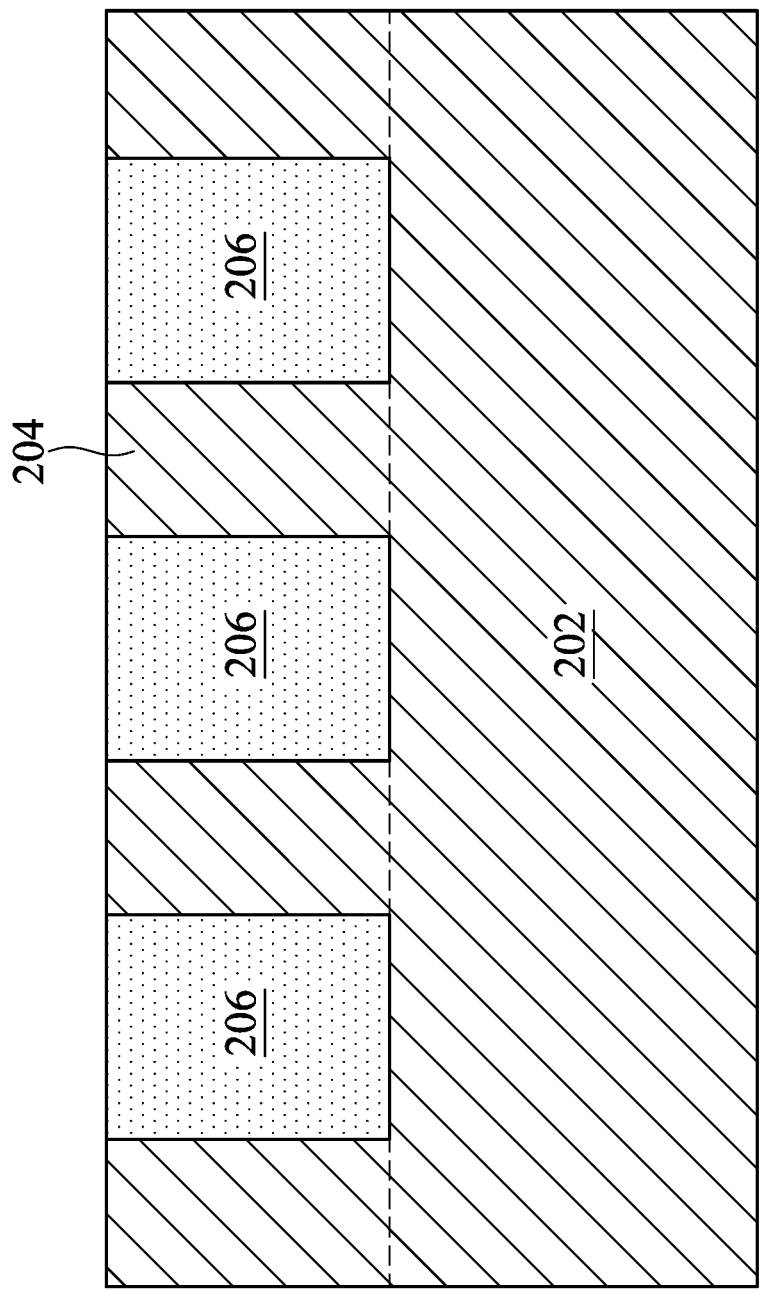
FIGS. 2A-2E are cross-sectional views of the semiconductor structure at various stages of the method, in accordance with some embodiments.

Referring to FIGS. 1 and 2A, the method 100 includes operation 102, in which a substrate 202 including a plurality of semiconductor fins 204 is provided. FIG. 2A is a cross-sectional view of an initial structure of the semiconductor structure 200, in accordance with some embodiments.

In some embodiments, the substrate 202 is a bulk semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as Ge, silicon carbide (SiC), SiGe, or diamond. Alternatively, the substrate 202 may include a compound semiconductor and/or an alloy semiconductor such as gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). Further, the substrate 202 may optionally include an epitaxial layer (epi-layer), may be strained for performance enhancement, may include a silicon-on-insulator (SOI) structure, and/or have other suitable enhancement features.

In various embodiments, the substrate 202 includes a plurality of semiconductor fins 204 extending therefrom. The semiconductor fins 204, like the substrate 202, may comprise silicon or another elementary semiconductor, such as germanium; a compound semiconductor including SiC, GaAs, GaP, InP, InAs, and/or InSb; an alloy semiconductor including SiGe, GaAsP AlInAs, AlGaAs, InGaAs, GaInP, and/or GaInAsP; or combinations thereof. In some embodiments, the semiconductor fins 204 include silicon. The semiconductor fins 204 are separated from one another by isolation structures 206. In some embodiments, the isolation structures 206 include a dielectric material such as, for example, dielectric oxide, dielectric nitride or dielectric oxyntirde. In some embodiments, the isolation structures 206 include silicon oxide, silicon nitride or silicon oxynitride.

In some embodiments, the semiconductor fins 204 may be fabricated using suitable processes including photolithography and etch processes. The photolithography process may include forming a photoresist layer (resist) overlying the substrate 202 (e.g., on a silicon layer), exposing the resist to a pattern, performing post-exposure bake processes, and developing the resist to form a patterned photoresist layer. In some embodiments, patterning the resist to form the patterned photoresist layer may be performed using an electron beam (e-beam) lithography process. The patterned photoresist layer may then be used as a mask to protect regions of the substrate 202 while an anisotropic etch forms trenches into the substrate 202, thereby leaving semiconductor fins 204 extending from a base portion of the substrate 202. The anisotropic etch may be a dry etch such as, for example, reactive ion etch (ME), a wet etch, or a combination thereof. After formation of semiconductor fins 204, the patterned photoresist layer is removed, for example, by stripping. Numerous other embodiments of methods to form the semiconductor fins 204 on the substrate 202 may also be used. For example, in some embodiments, the semiconductor fins 204 may be formed utilizing a sidewall image transfer (SIT) process. In the SIT process, spacers are formed on a mandrel. The mandrel is removed and the remaining spacers are used as a hard mask to etch the substrate 202. The spacers are then removed after semiconductor fins 204 are formed. In some embodiments, sequential SIT processes are utilized to form semiconductor fins 204 with highly scaled fin width and pitches. The semiconductor fins 204 may, for example, be formed with top and bottom dimensions of the fins being the same, i.e., the sidewalls of the semiconductor fins 204 are formed substantially vertical, or trapezoidal with top and bottom parts of the fins having different dimensions. The width of each semiconductor fin 204 is in a range of about 5 nm to about 40 nm in some embodiments, and in a range of about 7 nm to about 15 nm in other embodiments. The width of trenches between adjacent semiconductor fins 204 is in a range of about 5 nm to about 80 nm in some embodiments, and in a range of about 7 nm to about 15 nm in other embodiments. One skilled in the art will realize, however, that the dimensions and values recited throughout the descriptions are merely exemplary, and may be changed to suit different scales of integrated circuits.

The trenches between the semiconductor fins 204 are then filled with a dielectric material to form the isolation structures 206. The dielectric material may be deposited using any suitable deposition process. In some embodiments, the deposition of the dielectric material is performed for example, by chemical vapor deposition (CVD), plasma enhanced chemical vapor deposition (PECVD), or physical deposition. In some embodiments, the isolation structures 206 are formed by a flowable CVD process during which a flowable dielectric material is deposited by spin coating and a post-deposition anneal is then performed to convert the flowable dielectric material into silicon oxide. Examples of flowable dielectric material include, but are not limited to, silicate, siloxane, methyl silsesquioxane (MSQ), hydrogen silsesquioxane (HSQ), perhydrosilazane (TCPS), perhydropolysilazane (PSZ), tetraethyl orthosilicate (TEOS), and a silyl-amine, such as trisilylamine (TSA). In some embodiments, the flowable dielectric material is annealed at a temperature ranging from about 1000° C. to about 1200° C. Excess deposited dielectric material is subsequently removed from above the top surfaces of the semiconductor fins 204, for example, by a CMP and/or an etch back process. After planarization, the top surfaces of the semiconductor fins 204 and the isolation structures 206 are coplanar with respect to one another.

Figure 2B:
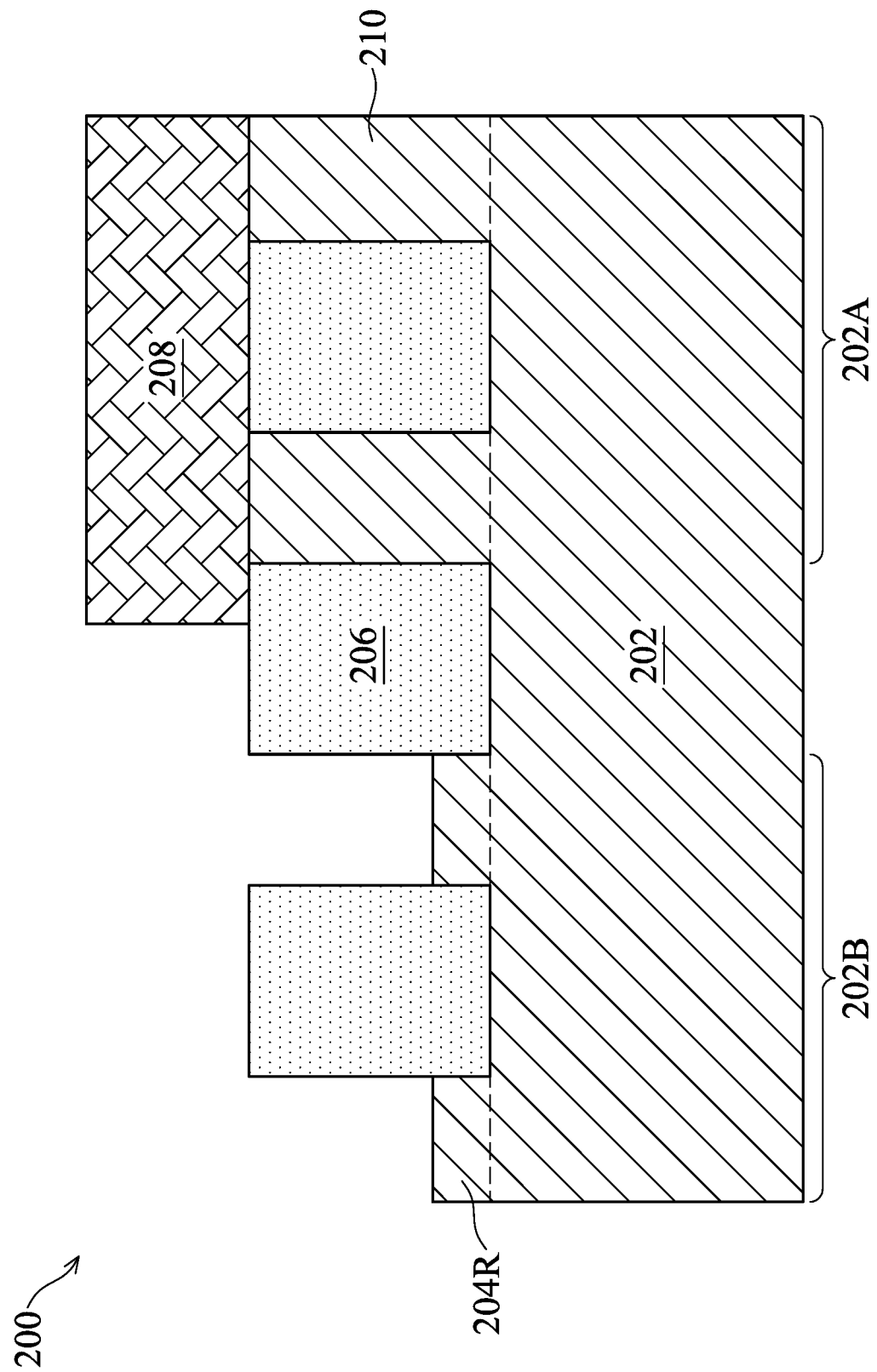

Referring to FIGS. 1 and 2B, the method 100 proceeds to operation 104, in which a subset of semiconductor fins 204 in a second region 202B of the substrate 202 are recessed. FIG. 2B is a cross-sectional view of the semiconductor structure 200 of FIG. 2A after recessing the subset of semiconductor fins 204 in the second region 202B of the substrate 202, in accordance with some embodiments.

In some embodiments, portions of the semiconductor fins 204 in the second region 202B of the substrate 202 are recessed to provide recessed fins 204R in the second region 202B of the substrate 202. In some other embodiments, the recessing completely removes the semiconductor fins 204 in the second region 202B of the substrate 202, thereby exposing a surface of the base portion of the substrate 202 (not shown). In some embodiments, the recessing of the subset of the semiconductor fins 204 in the second region 202B of the substrate 202 may be performed by first forming a patterned photoresist layer 208 to cover a first subset of the semiconductor fins 204 in the first region 202A of the substrate 202, while exposing a second subset of the semiconductor fins 204 in the second region 202B of the substrate 202. In some embodiments, the patterned photoresist layer is formed by first applying a resist on the substrate 202, followed by exposing the resist to a pattern, and then removing the exposed or unexposed portion of the resist depending on whether the positive or negative resist is used using a developer. Subsequently, the exposed second subset of the semiconductor fins 204 in the second region 202B of the substrate 202 are etched using an isotropic etch or an anisotropic etch. The etch can be a dry etch such as RIE, a wet etch, or a combination thereof. The etch selectively removes the subset of the semiconductor fins 204 in the second region 202B of the substrate 202, but does not substantially affect the isolation structures 206. In some embodiments, a timed etch using an etchant solution of tetramethylammonium hydroxide (TMAH) or carbon tetrafluoride ($CF_4$) is performed. After etching, the patterned photoresist layer 208 is removed, for example, by stripping to expose the first subset of the semiconductor fins 204 in the first region 202A of the substrate. The first subset of the semiconductor fins 204 in the first region 202A of the substrate 202 are referred to as first fins 210.

Figure 2C:
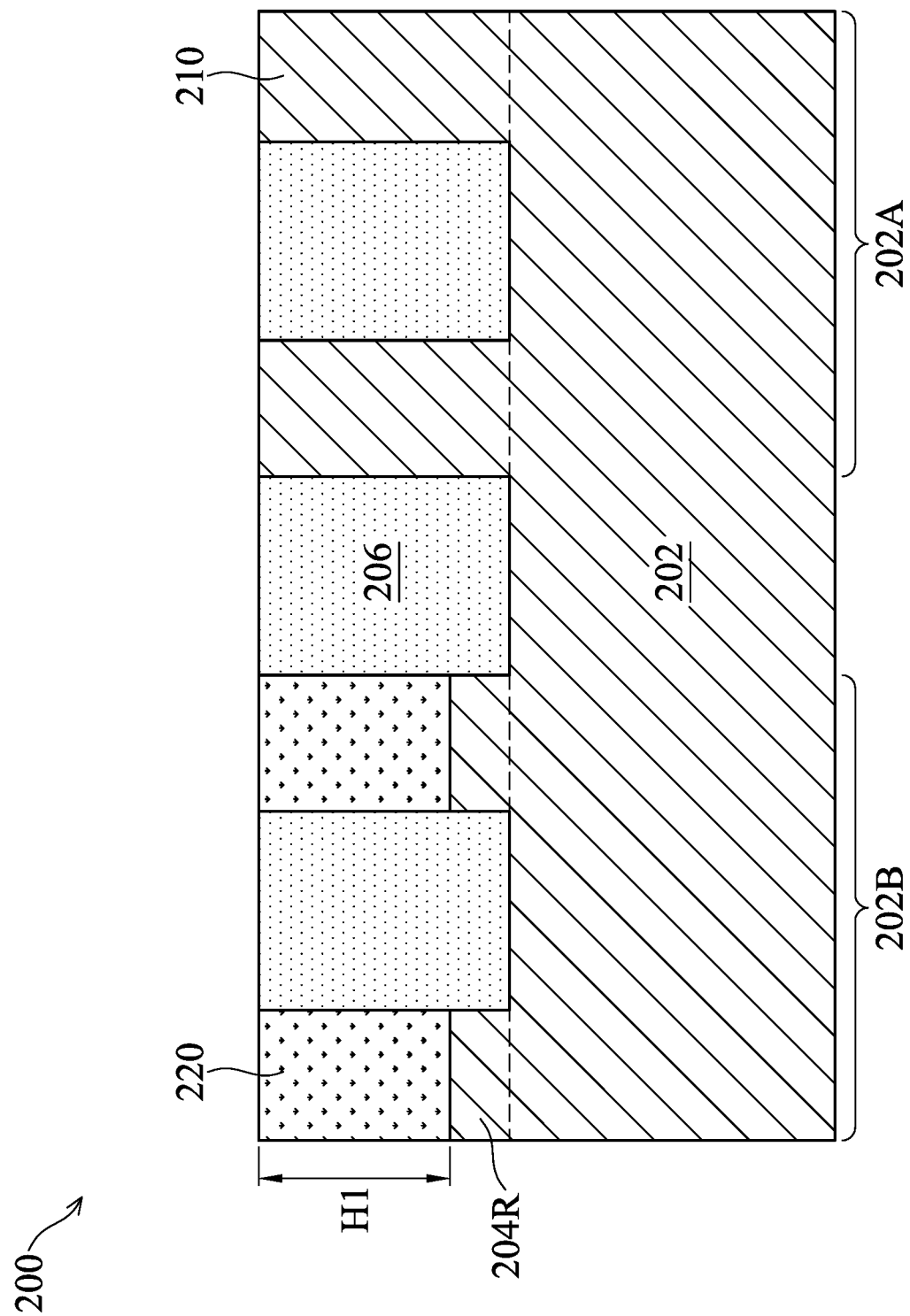

Referring to FIGS. 1 and 2C, the method 100 proceeds to operation 106, in which second fins 220 are formed in the second region 202B of the substrate 202. FIG. 2C is a cross-sectional view of the semiconductor structure 200 of FIG. 2B after forming second fins 220 in the second region 202B of the substrate 202, in accordance with some embodiments.

In some embodiments, the second fins 220 include a semiconductor material that is different from the semiconductor material that provides the first fins 210. In some embodiments, the first fins 210 include silicon, and the second fins 220 include SiGe or Ge. In some embodiments, the Ge concentration in SiGe can be between about 15% and about 100%.

In some embodiments, the second fins 220 are formed by epitaxial grown of a Ge-containing semiconductor material, e.g., Ge or SiGe, from the recessed fins 204R. The epitaxial growth process may include metalorganic chemical vapor deposition (MOCVD), molecular beam deposition (MBE), low pressure chemical vapor deposition (LPCVD), or other suitable deposition processes. In some embodiments, the deposition is performed at a temperature ranging from about 600° C. to 850° C. Exemplary gases that can be employed as a source of Si include, but are not limited to, silane ($SiH_4$), dichlorosilane ($SiH_2Cl_2$), and silicone tetrachloride ($SiCl_4$). Exemplary gases that can be employed used as a source of Ge include, but are not limited to, germane ($GeH_4$) and germane tetrachloride ($GeCl_4$). During the epitaxial growth, the Ge-containing semiconductor material is only grown from semiconductor surfaces such as surfaces of the recessed fins 204R, but not grown from dielectric surfaces, such as surfaces of isolation structures 206 and the patterned photoresist layer 208 (FIG. 2B) covering the first fins 210. In some embodiments, the epitaxial growth process is continued until the top surfaces of the second fins 220 are coplanar with the top surfaces of the isolation structures 206. In some other embodiments, the epitaxial growth process is continued until the top surfaces of the second fins 220 are above the top surfaces of the isolation structures 206. In some embodiments, the height H1 of the second fins 230 thus formed is from about 40 nm to about 80 nm. After formation of the second fins 220, the patterned photoresist layer 208 is removed, for example, by stripping.

It should be noted that although the replacement of fin approach is used to integrate the first fins 210 and second fins 220 on the same substrate 202, other methods for integrating the first fins 210 and second fins 220 on the same substrate 202 are also contemplated.

Figure 2D:
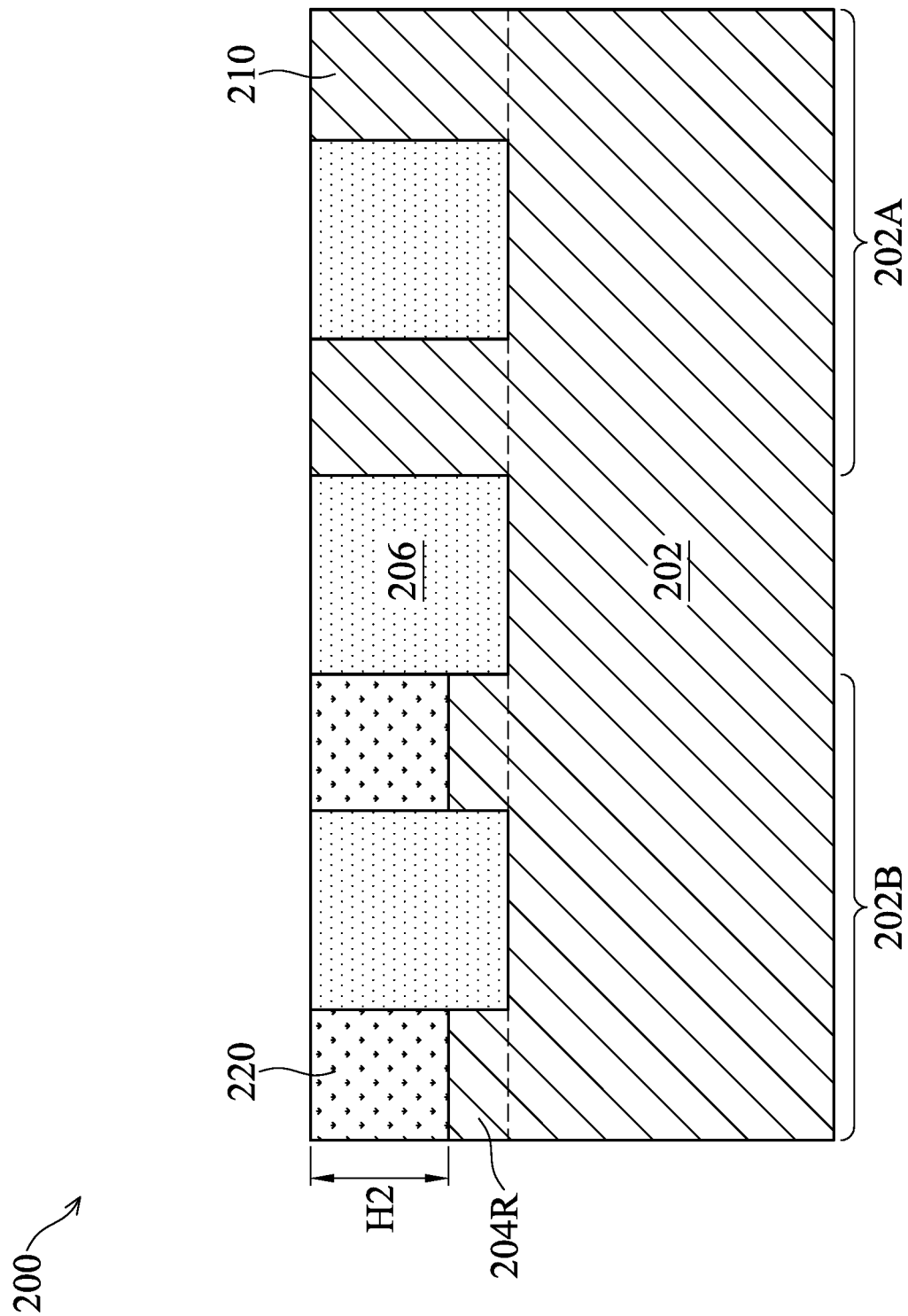

Referring to FIGS. 1 and 2D, the method 100 proceeds to operation 108, in which a CMP process is performed to reduce the height of the first fins 210 and second fins 220. FIG. 2D is a cross-sectional view of the semiconductor structure 200 of FIG. 2C after performing the CMP process.

The CMP process is capable of smoothing and thinning the first fins 210 and second fins 220. In some embodiments, the CMP process is performed using a CMP system 300 (FIG. 3). As shown in FIG. 3, in some embodiments, the CMP system 300 includes a polishing platen 312, a polishing pad 314 over the polishing platen 312, a polishing head 316 over the polishing pad 314, and a slurry dispenser 320. The slurry dispenser 320 has an outlet directly over the polishing pad 314 in order to dispense a polishing slurry 322 onto the polishing pad 314.

During the CMP process, the polishing slurry 322 is dispensed by the slurry dispenser 320 onto the polishing pad 314. The polishing slurry 322 includes one or more reactive chemicals that react with the surface layer of a substrate, e.g., substrate 202. Furthermore, the polishing slurry 322 includes abrasive particles for mechanically polishing the substrate 202. In some embodiments, the polishing slurry includes colloidal silica and has a pH in the range from about 2 to about 12.

During the CMP process, the substrate 202 is held face-down by the polishing head 316 against the polishing pad 314. The polishing head 316 is rotated, and hence causing the rotation of the substrate 202 fixed onto the polishing head 316. In some embodiments, the substrate 202 rotates in a direction at a rate in the order of about 1 revolutions per minute (rpm) to about 100 rpm. A force is also applied in the downward vertical direction against the substrate 202 and presses the substrate 202 against the polishing pad 314 as the substrate 202 is being polished. The force is typically in the order of from about 0.3 psi to about 4 psi and is applied by means of a shaft 318 that is attached to the back of the polishing head 316.

During the CMP process, the polishing platen 312 is rotated by, for example, a motor (not shown), and hence the polishing pad 314 fixed thereon is also rotated along with the polishing platen 312. In some embodiments, the polishing head 316 and the polishing pad 314 rotate in the same direction (clockwise or counter-clockwise). In some other embodiments and as in FIG. 3, the polishing head 316 and the polishing pad 314 rotate in the opposite directions. In some embodiments, the polishing pad 314 rotates at a rate in the order of about 1 rpm to about 100 rpm. With the rotation of the polishing pad 314 and polishing head 316, the polishing slurry 322 flows between the substrate 202 and the polishing pad 314. Through the chemical reaction between the reactive chemical in the polishing slurry 322 and the surface layer of the substrate 202, and further through the mechanical polishing, the surface layer of the substrate 202 including surfaces of first fins 210, second fins 220, and isolation structures 206 are planarized. In some embodiments, the CMP process is carried out at room temperature. The polishing time is controlled to remove about 10 nm to about 20 nm thick of the first semiconductor material, e.g., silicon, that provides the first fins 210 and the second semiconductor material, e.g., SiGe, that provides the second fins 220. In some embodiments, the polishing time may be from about 30 seconds to about 3 minutes. After the CMP process, the height H2 of the second fins 220 is from about 30 nm to about 50 nm.

Referring to FIG. 1, the method 100 proceeds to operation 110, in which the surface layer of substrate 202 is cleaned using a cleaning composition of the present disclosure to remove contaminants generated by the CMP process. The contaminants may include abrasive particles and organic chemicals from the polishing slurry and reaction by-products of the CMP process.

Figure 4:
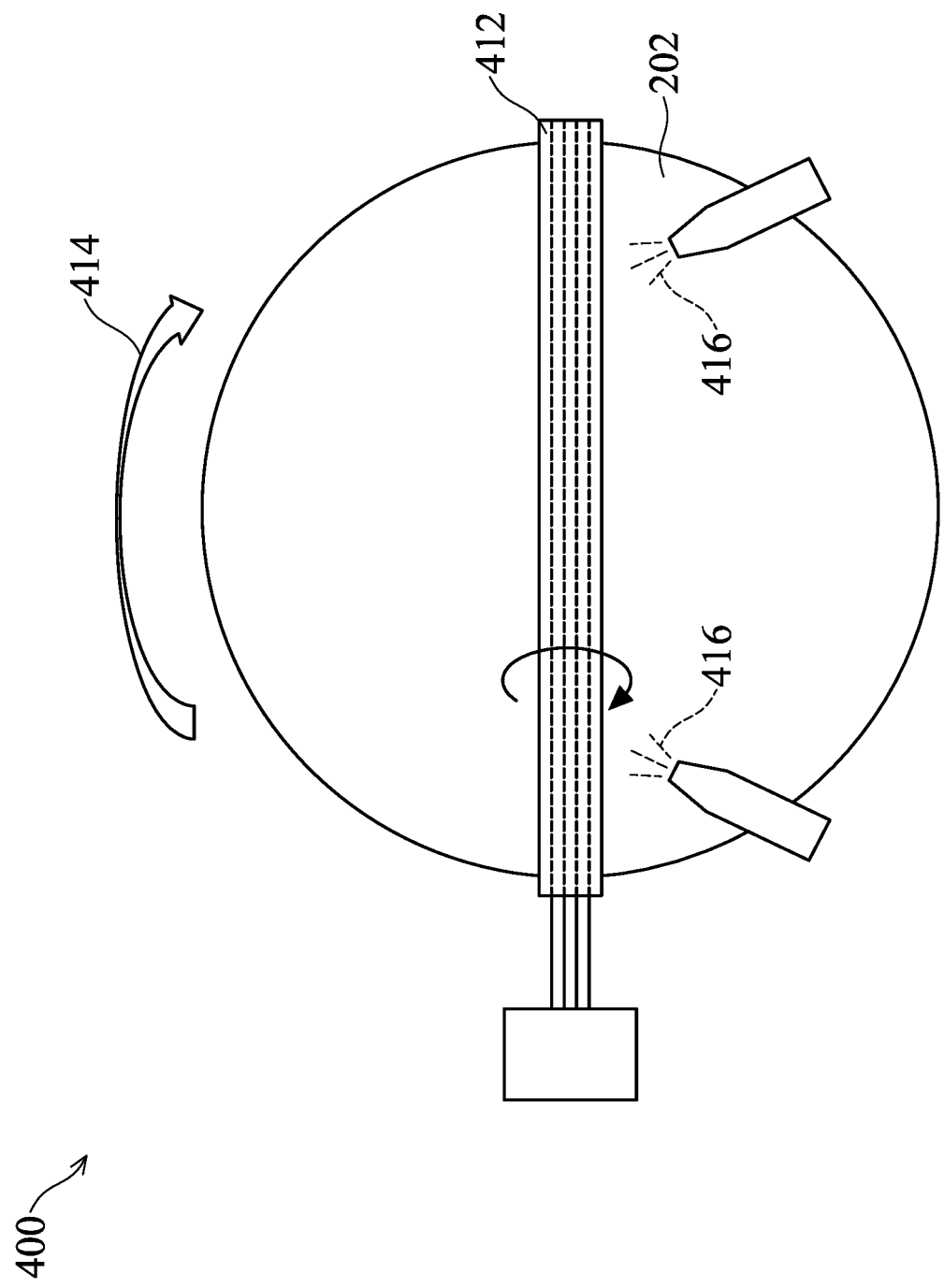
FIG. 4 is a top view of a cleaning apparatus, in accordance with some embodiments.

In some embodiments, the surface layer of the substrate 202 is cleaned using a cleaning apparatus 400 (FIG. 4). As shown in FIG. 4, in some embodiments, the cleaning apparatus includes a brush 412. In some embodiments, the brush 412 may be formed of polyvinyl alcohol (PVA), polyvinyl chloride (PVC), benzotriazole (BTA), or the like. Furthermore, in some embodiments, the brush 412 may be made to have the form of sponges. During the post-CMP cleaning process, the substrate, for example, substrate 202, is rotated, for example, as illustrated by arrow 414. In the meantime, the brush 412 also rotates with respect to its own axis. In some embodiments, the axis of the brush 412 is in the lengthwise direction of the brush 412, and is parallel to the surface layer of the substrate 202. In some embodiments, the brush 412 has a cylindrical shape. Also, when viewed from the right, as shown in FIG. 4, the cross-sectional view of the brush 412 is circular, and hence when the brush 412 rotates, contaminants are removed from the surface layer of the substrate 202.

During the cleaning, the cleaning composition 416 of the present disclosure including an oligomeric or polymeric polyamine is sprayed onto the surface layer of the substrate 202. In some embodiments, the polyamine includes ethylenediamine, diethylenetriamine, triethylenetetramine, tetraethylenepentamine, polyethyleneimine or polyvinyl amine. In some embodiments, the polyamine stated above also includes one or more hydroxyl groups. With the rotation of the substrate 202, the cleaning composition 416 is rolled into the brush 412, which uses the cleaning composition 416 to clean the surface layer of the substrate 202 when the brush 412 rotates.

In the present disclosure, the polyamine in the cleaning composition forms a passivation layer on the surfaces of the first fins 210 and second fins 220. The passivation layer prevents atmospheric oxygen from contacting the first fins 210 and second fins 220 during the post-CMP cleaning process, which helps to suppress the corrosion of Ge or SiGe fins. As a result, the surface smoothness of the first fins 210 and second fins 220 is improved. In some embodiments, the surface roughness of the first fins 210 and second fins 220 expressed by root mean square (rms) is less than 20 nm, less than 10 nm, less than 5 nm, less than 3 nm, less than about 1 nm, less than 0.5 nm or less than 0.2 nm. The improved surface smoothness helps to enhance the yield and performance of semiconductor devices made from these Ge or SiGe fins.

After cleaning using the cleaning composition 416, the substrate 202 is rinsed with DI water. During the rinse, the substrate 202 is also rotated, and the waste water generated by the rinsing is spun off from the substrate 202, and conducted away from the CMP cleaning apparatus 400.

The above described chemical composition cleaning step and water rinsing step may be repeated until the surface layer of the substrate 202 is determined to be clean when a pre-determined cleanness criteria is met.

After the post-CMP cleaning process, the substrate 202 is spun dry and then staged for next fabrication process.

Figure 2E:
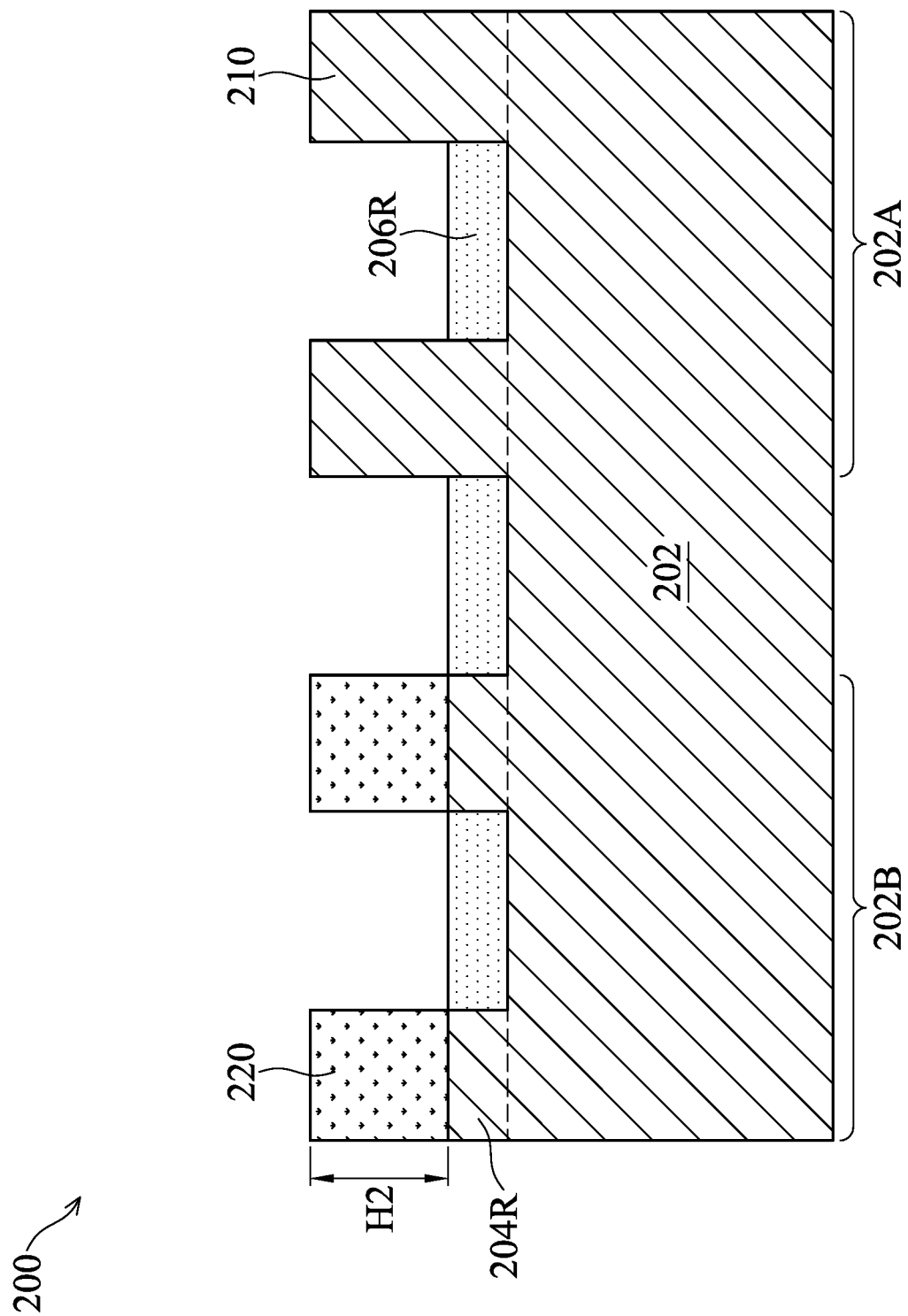

Referring to FIGS. 1 and 2E, the method 100 proceeds to operation 112, in which the isolation structures 206 are recessed to form recessed isolation structures 206R. FIG. 2E is a cross-sectional view of the semiconductor structure 200 of FIG. 2D after recessing the isolation structures 206 to form the recessed isolation structures 206R, in accordance with some embodiments.

Referring to FIG. 2E, the isolation structures 206 are recessed to form the recessed isolation structures 206R that surround bottom portions of the first fins 210 and second fins 220. After recessing, top surfaces of the isolation structures 206 are located below the top surfaces of the first fins 210 and the second fins 220 such that the upper portions of the first fins 210 and the second fins 220 are exposed. In some embodiments, the isolation structures 206 are recessed using an anisotropic etch. In some embodiments, the anisotropic etch is a plasma dry etch using a fluorine-based chemistry, such as $CF_4$, $SF_6$, $CH_2F_2$, $CHF_3$, and/or $C_2F_6$. The anisotropic etch selectively removes the dielectric material of the isolation structures 206 but does not substantially etch the first fins 210 and second fins 220.

Subsequently, related CMOS processing is employed to form n-type FinFETs and p-type FinFETs on the same substrate 202. For example, a first gate structure (not shown) can be formed over a portion of each first fin 210 and first source/drain regions (not shown) can be formed on opposite sides of the first gate structure to provide n-type FinFETs in the first region 202A of the substrate. A second gate structure (not shown) can be formed over a portion of each second fin 220 and second source/drain regions (not shown) can be formed on opposite sides of the second gate structure to provide p-type FinFETs in the second region 202B of the substrate 202. The gate structures can be formed utilizing a gate first or a gate last process known in the art. Each gate structure may include a gate dielectric and a gate conductor.

One aspect of this description relates to a cleaning composition. The cleaning composition includes an oligomeric or polymeric polyamine, at least one wetting agent, a pH adjusting agent, and a solvent.

Another aspect of this description relates to a method for removing contaminants from a substrate after a chemical mechanical polishing process. The method comprises providing a substrate, wherein a surface layer of the substrate compresses a silicon germanium region, and cleaning the surface layer of the substrate with a cleaning composition. The cleaning composition includes an oligomeric or polymeric polyamine.

Still another aspect of this description relates to a method of forming a semiconductor structure. The method includes forming a first fin in a first region of a substrate and a second fin in a second region of the substrate, the first fin comprising a first semiconductor material, the second fin comprising a second semiconductor material different from the first semiconductor material; performing a chemical mechanical polishing (CMP) process to reduce a height of the first fin and a height of the second fin; and cleaning surfaces of the first fin and the second fin using a cleaning composition, the cleaning composition comprising an oligomeric or polymeric polyamine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing contaminants from a substrate after a chemical mechanical polishing process, comprising:
   providing the substrate, wherein a surface layer of the substrate compresses a silicon germanium region; and
   cleaning the surface layer of the substrate with a cleaning composition, the cleaning composition comprising an oligomeric or polymeric polyamine, wherein cleaning the surface layer of the substrate comprises:
      supplying the cleaning composition to the surface layer of the substrate; and
      mechanically brushing the surface layer of the substrate while the cleaning composition is supplied to the surface.

2. The method of claim 1, wherein the oligomeric or polymeric polyamine comprises diethylenediamine, triethylenetetramine, tetraethylenepentamine, polyethyleneimine or polyvinyl amine.

3. The method of claim 1, wherein the oligomeric or polymeric polyamine comprises one or more hydroxyl functional groups.

4. The method of claim 1, wherein the oligomeric or polymeric polyamine is a primary amine, a secondary amine, a tertiary amine or a quaternary amine having at least two amino groups.

5. A method of forming a semiconductor structure, comprising:
   forming a first fin in a first region of a substrate and a second fin in a second region of the substrate, the first fin comprising a first semiconductor material, the second fin comprising a second semiconductor material different from the first semiconductor material;
   performing a chemical mechanical polishing process to reduce a height of the first fin and a height of the second fin; and
   cleaning surfaces of the first fin and the second fin using a cleaning composition, the cleaning composition comprising an oligomeric or polymeric polyamine.

6. The method of claim 5, wherein the first fin comprises silicon, and the second fin comprises SiGe.

7. The method of claim 5, wherein the oligomeric or polymeric polyamine comprises diethylenediamine, triethylenetetramine, tetraethylenepentamine, polyethyleneimine or polyvinyl amine.

8. The method of claim 5, wherein the oligomeric or polymeric polyamine comprises one or more hydroxyl functional groups.

9. The method of claim 5, further comprising cleaning the surfaces of the first fin and the second fin using deionized water.

10. The method of claim 1, wherein the cleaning composition further comprises a solvent.

11. A method for forming a semiconductor structure, comprising:
   forming a plurality of fins extending from a substrate, the plurality of fins separated from one another by isolation structures and comprising a first fin in a first region of the substrate and a second fin in a second region of the substrate;
   planarizing top surfaces of the plurality of fins and the isolation structures by a chemical mechanical polishing (CMP) process;
   removing contaminants generated by the CMP process from the top surfaces of the plurality of fins and the isolation structures by applying a cleaning composition to the top surfaces of the plurality of fins and the isolation structures, wherein the cleaning composition comprises an oligomeric or polymeric polyamine, at least one wetting agent, a pH adjusting agent and a solvent; and
   recessing the isolation structures to expose upper portions of the plurality of fins.

12. The method of claim 11, wherein the oligomeric or polymeric polyamine comprises diethylenediamine, triethylenetetramine, tetraethylenepentamine, polyethyleneimine or polyvinyl amine.

13. The method of claim 11, wherein the at least one wetting agent comprises an anionic, cationic, non-ionic or zwitterionic surfactant.

14. The method of claim 11, wherein the pH adjusting agent comprises an organic acid selected from C1-C6 alkyl carboxylic acid, nitric acid, sulfuric acid and C1-C6 alkyl sulfonic acid.

15. The method of claim 11, wherein the first fin comprises silicon, and the second fin comprises a Ge-containing semiconductor material.

16. The method of claim 11, wherein removing the contaminants generated by the CMP process from the top surfaces of the plurality of fins and the isolation structures comprises:
   rotating the substrate as the cleaning composition is applied to the top surfaces of the plurality of fins and the isolation structures; and
   brushing the top surfaces of the plurality of fins and the isolation structures using a brush.

17. The method of claim 16, wherein removing the contaminants generated by the CMP process from the top surfaces of the plurality of fins and the isolation structures further comprises rinsing the top surfaces of the plurality of fins and the isolation structures with water.

18. The method of claim 11, wherein the top surfaces of the plurality of fins have a surface roughness less than 20 nm after cleaning with the cleaning composition.

19. The method of claim 11, further comprising:
   patterning the substrate to form a plurality of semiconductor fins in the first region and the second region of the substrate;
   removing a semiconductor fin of the plurality of semiconductor fins from the second region of the substrate; and
   depositing a semiconductor material to epitaxially grow the second fin in the second region of the substate, thereby forming the plurality of fins.

20. The method of claim 11, wherein the isolation structures comprise silicon oxide, silicon nitride or silicon oxynitride.

* * * * *